United States Patent Office 3,827,891

Patented Aug. 6, 1974

3,827,891

HIGH ADHESION METALLIZING COMPOSITIONS

John R. Larry, Wilmington, Del.
(396 Dansworth Road, Youngstown, N.Y. 14174)

No Drawing. Continuation of application Ser. No. 186,383, Oct. 4, 1971, which is a continuation-in-part of application Ser. No. 146,799, May 25, 1971, which in turn is a continuation-in-part of application Ser. No. 99,318, Dec. 17, 1970, all now abandoned. This application June 11, 1973, Ser. No. 369,116

Int. Cl. C09d 5/24

U.S. Cl. 106—1 10 Claims

ABSTRACT OF THE DISCLOSURE

Metallizing compositions comprising noble metal(s) and, in particular, inorganic binder which contains a glass composed of 30–50% PbO, 30–40% $SiO_2$, 2–8% $Al_2O_3$, 2–8% $B_2O_3$, 2–15% CaO, 0.5–5% $TiO_2$ and $ZrO_2$. These compositions are applied to a dielectric substrate and used in the electronic industry to form highly dense films which exhibit good solderability, good solder leach resistance, good initial adhesion and good thermal aged adhesion.

CROSS-REFERENCE TO RELATED APPLICATIONS

This application is a continuation of Ser. No. 186,383, filed Oct. 4, 1971, which is a continuation-in-part of Ser. No. 146,799, filed May 25, 1971, which in turn is a continuation-in-part of Ser. No. 99,318, filed Dec. 17, 1970, all assigned to the assignee of the present invention and now abandoned.

BACKGROUND OF THE INVENTION

Modern electronic circuitry emphasizes compactness of component assemblies, to which metallizing compositions are an important adjunct. Small assemblies of electronic components are fastened to a ceramic plate, or substrate, and interconnected by means of electrode or conductor lines printed and fired onto the ceramic substrate. Such printed conductors should be mechanically strong and resistant to thermal shock and atmospheric contaminants. Of particular importance are noble metal-containing metallizing compositions and electrodes therefrom. An essential advantage conferred by the noble metal metallizing composition over ordinary, non-noble metal compositions is the capability to be fired in air at high temperatures without being oxidized, thereby retaining good electrical conductivity while maintaining surface that can be wet by molten solder or brazing alloys.

Metallizing compositions normally contain, in addition to noble metals, an inorganic binder. The inorganic binder functions primarily to bind together the particulate noble metal and also to cause the metal to adhere to the ceramic substrate. The binder is usually a powdered glass and the nature of the glass has significant effects on the overall properties of the fired metallizing composition. There is a considerable need for metallizing compositions which can be used for high performance applications. More specifically, metallizing compositions which yield dense fired films and which exhibit good solderability, good solder leach resistance, good initial adhesion and good thermal aged adhesion are in constant demand by the electronic industry.

SUMMARY OF THE INVENTION

This invention relates to novel glasses for use in metallizing compositions comprising, in weight percent, 30–50% PbO, 30–40% $SiO_2$, 2–20% CaO, 2–8% $Al_2O_3$, 2–8% $B_2O_3$, 0.5–5% $TiO_2$ and 0.5–5% $ZrO_2$. The metallizing compositions of this invention comprise 60–98% finely divided noble metal and 2–40% finely divided inorganic binder, wherein said binder contains the above-described glass. These metallizing compositions possess a good combination of all of the desirable properties mentioned above.

DESCRIPTION OF THE PREFERRED EMBODIMENTS

The metal portion of the metallizing composition comprises a noble metal, a mixture of one or more noble metals, an alloy of one or more noble metals and combinations thereof. Platinum, palladium, silver, gold, rhodium, iridium, ruthenium, and osmium are the noble metals utilized in this invention. The noble metals comprise 60–98%, by weight, of the metallizing compositions.

The inorganic binder of the present metallizing composition comprises a glass having a particular combination of metal oxides in critical proportionate amounts. The glass comprises:

TABLE I

| | Weight percent | |
|---|---|---|
| | Operable | Preferred |
| PbO | 30-50 | 40-50 |
| $SiO_2$ | 30-40 | 32-38 |
| CaO | 2-20 | 5-15 |
| $Al_2O_3$ | 2- 8 | 3- 6 |
| $B_2O_3$ | 2- 8 | 3- 6 |
| $TiO_2$ | 0.5- 5 | 0.5- 4 |
| $ZrO_2$ | 0.5- 5 | 0.5- 4 |

The above combination of metal oxides in the above proportions were necessary to produce inorganic binders which are useful in highly adherent metallizing compositions which produce fired metallizations having the previously described desirable properties. It is pointed out that the inorganic binder may comprise, in addition to the above-described glass, glass wetting agents such as bismuth oxide.

All of the noble metal and inorganic binder components should generally be in a finely divided or powder form, i.e., in the form of powders sufficiently finely divided to pass through a 325 mesh (Standard Sieve Scale) stencil screen, said powder having particles no larger than about 40 microns. Generally, the average particle size of the metal will range from 0.1–5 microns while an average particle size range of 1 to 15 microns for the inorganic binder is preferred.

The inorganic binder:metal ratio has an effect on the conductivity, the adhesion and the surface properties of the ultimate metal films. As the proportionate amount of binder increases, the adhesion also increases; but the conductivity and surface wettability decrease in the films. The proper balance must be maintained between the conductivity, adhesion and surface properties. The metallizing compositions of this invention should contain from 60–98%, by weight, finely divided noble metal and, correspondingly, from 2–40% by weight finely divided inorganic binder. At least 2% inorganic binder is necessary to provide adequate adhesion of the metallizing composition to the substrate. On the other hand, the use of more than 40% by weight inorganic binder provides films which do not accept solder readily.

The metallizing compositions of the invention will generally, although not necessarily, be dispersed in an inert liquid vehicle to form a paint or paste for application to the dielectric substrate. The proportion of the metallizing composition:vehicle may vary considerably depending upon the manner in which the paint or paste is to be applied and the kind of vehicle used. Generally, from 1 to 20 parts by weight of metallizing composition (metals, inorganic binder, etc.) per part by weight of vehicle will be used to produce a paint or paste of the desired consistency. Preferably 3 to 10 parts of metallizing composition per part of vehicle will be used.

Any liquid, preferably inert, may be employed as the vehicle. Water or any one of various organic liquids with or without thickening and/or stabilizing agents and/or other common additives, may be utilized as the vehicle. Examples of organic liquids that can be used are the higher alcohols, such as decanol; esters of the lower alcohols, for example, the acetates and propionates; the terpenes, such as pine oil, alpha- and beta-terpineol and the like; and solutions of resins, such as the polymethacrylates of lower alcohols, or solutions of ethyl cellulose, in solvents such as pine oil. The vehicles of U.S. 3,536,508 may also be utilized. The vehicle may contain or be composed of volatile liquids to promote fast setting after application; or it may contain waxes, thermoplastic resins, or like materials which are thermofluid so that the composition may be applied at an elevated temperature to a relatively cold ceramic substrate upon which the composition sets immediately.

The metallizing compositions are conventionally made by admixing the metal(s) and inorganic binder solids in the proportions of 60–98% and 2–40%, respectively, based on their total combined weight. Additionally, one part of an inert liquid vehicle for every 1 to 20 parts of solids mentioned above may be admixed. Then the metallizing composition is applied to a dielectric ceramic substrate and fired to form a conductive film. The invention is illustrated by the following examples. In the examples and elsewhere in the specification, all parts, percentages and proportions of materials or components are by weight.

Various glass compositions, listed in Table II, were prepared in frit form by melting the respective batch compositions and pouring the homogeneous melt into water. The fritted products were then ground to fine powders with particle size ranging from 0.1–10 microns. Metallizing compositions were then prepared by admixing 87% finely divided noble metals (66% gold, 18% platinum and 3% palladium) and 13% inorganic binder (6% $Bi_2O_3$ and 7% glass from Table I). Binary gold-platinum and gold-palladium alloys would give essentially equivalent results for the purposes of this invention. The metallizing compositions were then dispersed in a liquid vehicle consisting of 10% ethyl cellulose and 90% beta-terpinol at a ratio of approximately 4:1. These compositions were then screen printed onto ceramic substrates (2.5 cm. square) through a patterned 200-mesh screen having 16 openings with dimensions of .25 cm. by .25 cm. The prints were dried and fired in a belt furnace at peak temperatures ranging from 850–950° C. The fired chips were dip soldered in 62 Sn/36 Pb/2 Ag solder. Tinned copper wires were dip soldered onto the printed metallizing compositions which were in the form of .25 cm. by .25 cm. pads.

The adhesion was measured by pulling the soldered leads with Chatillon tester. Accelerated aging tests were conducted by keeping the soldered chip with lead attachments at 125° C. for 100 hours prior to determining the bond strength. Solder leach resistance was assessed by using the following test: A fired sample containing a .055 cm. wide line was fluxed and dip soldered in a 60 Sn/36 Pb/2 Ag solder for 10 seconds, allowed 2–3 seconds for solder leveling, and quenched in trichloroethylene. This cycle was repeated until the .055 cm. line leached through or until 25 cycles were passed at which time the test was terminated. Such binary and ternary gold-platinum-palladium compositions which pass 15 cycles and exhibited adhesion values of 6–8 lbs. are generally quite acceptable for most applications. Useful results are obtained from the invention with the other noble metals as well, including gold, silver, and gold-silver alloys.

The results of the tests described above are set forth in Table III for Examples 1–3 which used glasses A–C, respectively (see Table II).

TABLE II

| | A | B | C |
|---|---|---|---|
| PbO | 45.3 | 40 | 35 |
| $SiO_2$ | 34.4 | 35 | 35 |
| $Al_2O_3$ | 4.9 | 5 | 5 |
| $B_2O_3$ | 4.0 | 5 | 5 |
| CaO | 9.7 | 10 | 10 |
| $TiO_2$ | 1.0 | 2.5 | 5 |
| $ZrO_2$ | .7 | 2.5 | 5 |

TABLE III

| Example | Glass | Solderability | Solder leach resistance | Adhesion (lbs.) Fired 850° C. Init. | Fired 850° C. Aged | Fired 900° C. Init. | Fired 900° C. Aged | Fired 950° C. Init. | Fired 950° C. Aged |
|---|---|---|---|---|---|---|---|---|---|
| 1 | A | Excellent | >25 cycles | 15.5 | 13.9 | 14.4 | 12.7 | 14.3 | 11.3 |
| 2 | B | Good | do | 13.6 | | | | | |
| 3 | C | do | do | 11.5 | | | | | |

EXAMPLE 4

A metallizing composition comprising 80% finely divided noble metals (29% palladium and 51% silver) and 20% inorganic binder (9% $Bi_2O_3$ and 11% of glass A) was dispersed in a liquid vehicle at a weight ratio of approximately 4:1. More specifically, the ingredients were provided in the following percentages by weight: 22.22% palladium, 40.44% silver, 8.88% glass, 7.42% bismuth oxide, and the remainder or 20.98% inert vehicle. The procedures of Example 1 were followed except that the printed metallizations were in the form of .13 x .13 cm. pads and the firing temperature was 850° C. The initial adhesion was 4.5 lbs. and after 48 hours at 150° C., the aged adhesion was 2.8 lbs. The solderability and the solder leach resistance of 9 cycles were considered good. Prior to the present invention, initial adhesion of over 4.0 lbs. would have been quite good, but the aged adhesion would often go to 1.0 lbs. or less.

In contrast, a metallizing composition of the prior art was prepared and tested in exactly the same manner as described above. The metallizing composition comprised 86% finely divided noble metal (30% palladium and 56% silver) and 14% finely divided inorganic binder (10% $Bi_2O_3$ and 4% of a glass consisting of 27.2% ZnO, 25.4% $B_2O_3$, 23.5% $SiO_2$, 6.4% $Al_2O_3$, 4.0% $ZrO_2$, 1.0% BaO, 4.0% CaO and 8.5% $Na_2O$). The ratio of solids to liquid was approximately 7:3. The initial adhesion was 2.9 lbs. while the aged adhesion dropped to 0.7 lbs. The solderability was considered good and the solder leach resistance was 4 cycles.

I claim:

1. In a metallizing composition adapted to be fired onto a dielectric substrate to form highly adherent films, said composition comprising, in weight percent, 60–98% finely divided noble metal(s) and 2–40% finely divided inorganic glass frit binder, the improvement comprising as said binder, a glass consisting essentially of:

| | Percent by weight |
|---|---|
| PbO | 30–50 |
| $SiO_2$ | 30–40 |
| CaO | 2–20 |
| $Al_2O_3$ | 2–8 |
| $B_2O_3$ | 2–8 |
| $TiO_2$ | 0.5–5 |
| $ZrO_2$ | 0.5–5 |

2. A composition in accordance with Claim 1 wherein $Bi_2O_3$ in admixture with said glass.

3. A composition in accordance with Claim 1 wherein the noble metal comprises platinum, palladium and gold.

4. A composition in accordance with Claim 1 wherein the noble metal comprises platinum and gold.

5. A composition in accordance with Claim 1 wherein the noble metal comprises palladium and gold.

6. A composition in accordance with Claim 1 wherein the noble metal comprises palladium and silver.

7. A composition in accordance with Claim 1 wherein the noble metal comprises at least one of gold and silver.

8. A composition in accordance with Claim 1 wherein said glass consists of 40–50% PbO, 32–38% $SiO_2$, 5–15% CaO, 3–6% $Al_2O_3$, 3–6% $B_2O_3$, 0.5–4% $TiO_2$ and 0.5–4% $ZrO_2$.

9. A paste composition comprising the metallizing composition of Claim 2 dispersed in an inert liquid vehicle.

10. A dielectric substrate having the metallizing composition of Claim 1 in firmly adherent relationship thereto.

References Cited

UNITED STATES PATENTS

| | | | |
|---|---|---|---|
| 3,352,797 | 11/1967 | Kim | 252—514 |
| 3,440,182 | 4/1969 | Hoffman | 106—1 |
| 3,505,134 | 4/1970 | Short | 252—514 |
| 3,586,522 | 6/1971 | Hoffman | 252—514 |

LORENZO B. HAYES, Primary Examiner

U.S. Cl. X.R.

117—123 B, 124 C, 227; 252—514